United States Patent [19]

Gutsche

[11] Patent Number: 4,464,222
[45] Date of Patent: Aug. 7, 1984

[54] PROCESS FOR INCREASING SILICON THERMAL DECOMPOSITION DEPOSITION RATES FROM SILICON HALIDE-HYDROGEN REACTION GASES

[75] Inventor: Henry W. Gutsche, St. Louis, Mo.
[73] Assignee: Monsanto Company, St. Louis, Mo.
[21] Appl. No.: 172,623
[22] Filed: Jul. 28, 1980
[51] Int. Cl.³ .............................................. C30B 25/10
[52] U.S. Cl. ............................ 156/613; 156/DIG. 89
[58] Field of Search ....... 156/DIG. 84, 610, 612–614, 156/DIG. 89; 148/175; 423/348, 349; 118/715, 718, 720; 427/255.5, 248.1, 86, 95

[56] References Cited

U.S. PATENT DOCUMENTS

| | | | |
|---|---|---|---|
| 3,011,877 | 12/1961 | Schweickert et al. | 423/349 |
| 3,036,892 | 5/1962 | Siebertz | 423/349 |
| 3,147,141 | 9/1964 | Ishizuka | 423/349 |
| 3,341,376 | 9/1967 | Spenke et al. | 156/613 |
| 3,496,037 | 2/1970 | Jackson, Jr. et al. | 156/613 |
| 3,508,962 | 4/1970 | Manasevit et al. | 156/613 |
| 3,969,163 | 7/1976 | Wakefield | 156/613 |
| 4,147,814 | 4/1979 | Yatsurugi et al. | 423/349 |

Primary Examiner—Hiram H. Bernstein
Attorney, Agent, or Firm—P. L. Passley

[57] ABSTRACT

Process for increasing silicon deposition rates from silicon halide-hydrogen reaction gases wherein electronic-grade silicon bodies are produced from the deposition of silicon upon silicon slim rods heated and introduced into and pulled through a chemical vapor deposition chamber, the increased silicon deposition rates resulting from introducing small percentages by weight of silane to the silicon halide-hydrogen reaction gases, for example, silicon tetrachloride and/or trichlorosilane.

12 Claims, 1 Drawing Figure

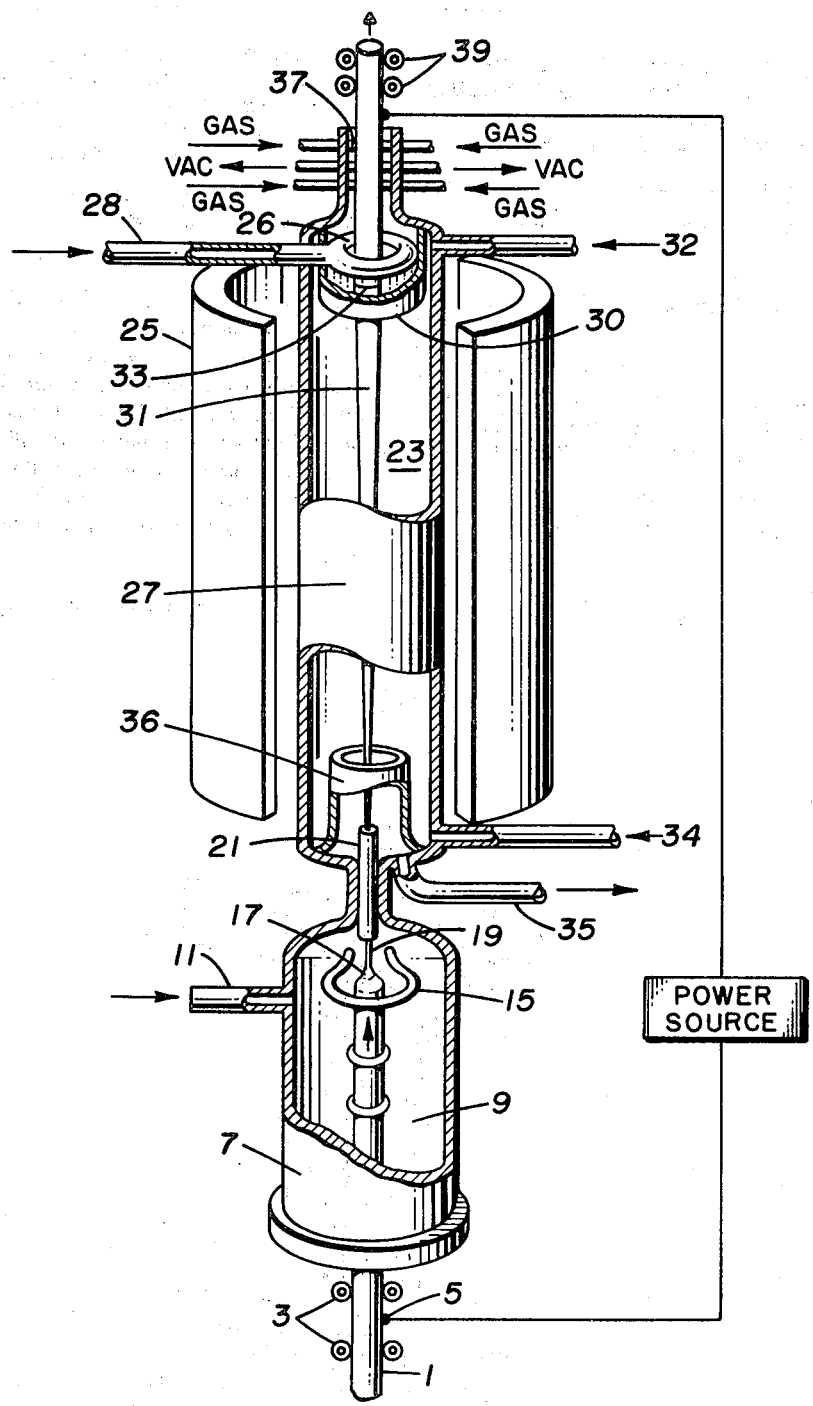

PROCESS FOR INCREASING SILICON THERMAL DECOMPOSITION DEPOSITION RATES FROM SILICON HALIDE-HYDROGEN REACTION GASES

BACKGROUND OF THE INVENTION

This invention relates to a process for continuously growing silicon bodies resulting from chemical vapor deposition upon seed rods. In another aspect the invention relates to the continuous deposition of single crystal silicon bodies from continuously pulled virgin slim rod formed in situ, followed by heating of the slim rod to temperatures which provide suitable surface conditions for contacting silicon halide-hydrogen reaction gases with the rod in a chemical vapor deposition chamber having in combination different gas curtains along the chamber inner wall, followed by removal of the resulting single crystal silicon body from the chamber. In yet another aspect the invention relates to a process for increasing the silicon deposition rate from silicon halide-hydrogen reaction gases within the chemical vapor deposition chamber environment, the increased silicon deposition rate resulting from increasing small percentages by weight of silane to the silicon halide-hydrogen reaction gases.

In the semiconductor industry, it is common to deposit material from the gaseous state onto a substrate for the purpose of forming various electronic devices. In some applications the material deposition from the gas is the same material as that from which the substrate is formed, while in other instances it is a different material from that from which the substrate is formed. As an example of the former, in the growth of silicon by vapor deposition techniques, it is common to position an elongated silicon filament between two graphite electrodes each of which extends through the end of a quartz container within which the filament is placed. A potential is impressed across the graphite electrodes causing a current to flow through the filament. The resistance of the filament to a temperature generally in excess of about 1100° C.

A gas stream, which comprises a mixture of trichlorosilane and hydrogen and/or other silanes is introduced into the quartz chamber and after flowing along the longitudinal axis of the filament is withdrawn from the chamber. The gas stream, upon contacting the hot surface silicon filament, will react to deposit polycrystalline silicon on the filament, thus increasing the diameter of the filament. The reaction of the trichlorosilane and hydrogen may be generally illustrated by the following simplified formula:

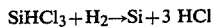

$$SiHCl_3 + H_2 \rightarrow Si + 3\ HCl$$

Gas flow through the quartz cylinder or reaction chamber is usually continued for several hours to increase the diameter of the filament, which may be one-tenth inch in diameter upon commencement of the deposition, to the diameter in excess of five inches. When the silicon rod has reached a desired diameter, the flow is terminated and the rod is removed from the reaction chamber. Material deposited on the silicon filament will be polycrystalline and therefore must be zone melted to produce a single crystalline material. Alternatively, the poly crystal rod may be melted in a crucible and a large single rod is "pulled" from the melt by way of a variety of apparatus such as a Czochralski puller.

In both commercially accepted methods of producing single crystal silicon for the electronics industry, that is by float zone or by Czochralski, the single crystal rod which is drawn from a melt in both cases is rotated and results from the pulling of the melt in the form of the single crystal rod. Such methods require considerable skilled technician monitoring as well as multiple furnaces requiring substantial energy for operation. Even under the best conditions, frequently the crystal is lost during the first stage which means that the rod being pulled converts to a polysilicon growth zone; thus terminating the growth procedure of the rod. Such commercial methods of producing remelt single crystal silicon rod materials are costly in time and effort and frequently produce irregularly shaped cylindrical rods requiring substantial premachining before slicing and conversion into wafers for use in the electronics industry.

Recent developments in the semiconductor industry have created a growing demand for low-cost single crystal silicon of extremely high purity, which is known as semiconductor grade silicon. Semiconductor grade silicon is used in the manufacture of semiconductor devices, such as transistors, rectifiers, solar cells, and the like. Processes are in use in the prior art producing single crystal silicon through the remelting of polycrystalline semiconductor grade silicon.

The prior art processes have demonstrated the technical and economic feasibility of producing high purity polycrystalline silicon of semiconductor quality by hydrogen reduction of silicon halides. All commercial semiconductor polycrystalline silicon presently being manufactured through chemical vapor deposition processes employ hydrogen reduction of trichlorosilane or silicon tetrachloride and the deposition of silicon on electrically heated silicon filament substrate.

This method relates to a method for producing high purity silicon or other semiconductor materials primarily for semiconductor device use and, in particular, to an improvement of the Siemen's process as described by Gutsche, Reuschel, and Schweickert in U.S. Pat. No. 3,011,877 and by Gutsche in U.S. Pat. No. 3,042,494. According to these prior art patents, elemental silicon is obtained in the form of cylindrical rods of high purity by decomposing silicon halides from the gas phase at a hot surface of the purified silicon filament, the preferred halides being the chlorides, silicon tetrachloride and trichlorosilane. These compounds become increasingly unstable at temperatures above 800° C. and decompose in two ways: (1) After adsorption on a hot surface which can provide a substrate for heterogeneous nucleation, for example, when the silicon halide concentration in the gas phase is kept relatively low by adding hydrogen as a diluent, the hydrogen also acts as a reducing agent; (2) in the case of high halide concentration in the gas phase, homogeneous nucleation occurs and the resulting silicon forms a dust of extremely fine particle size which is unsuitable for further processing. Heterogeneous nucleation hence silicon deposition starts at about 800° C. and extends to the melting point of silicon at 1420° C. Since the deposition is beneficial only on the substrate, the inner walls of the decomposition chamber must not reach temperatures near 800° C.

On the other hand, the deposition chamber wall temperature must not be much lower than about 500° C. because a cold wall is an effective heatsink and can easily overtax the ability of the electronic current passage through the substrate filament. Increasing the current through the substrate is not possible as a consequence of the negative temperature coefficient of resistivity in silicon which causes the electronic current to flow preferentially through the center of the cross section of the filament creating and maintaining thus an overheated core. Filaments with surface temperatures of over 1300° C., for example, have usually a molten core. One embodiment of U.S. Pat. No. 3,042,494 describes the wall temperature can be effectively controlled by varying the amount and speed of the air circulation over the outside of the decomposition chamber. However, as the deposition progresses, the filament grows into rods of great weight, diameter and surface area which gives off radiant energy at least 10% of which is absorbed by the quartz wall where the wall is absolutely clear. Much more energy is absorbed when the quartz does not transmit readily because of flaws within the quartz wall or just a general roughness of the quartz surface. Experience has indicated that the cooling air alone cannot satisfactorily solve the overall needs of silicon chemical decomposition chambers.

Epitaxially grown single crystal silicon by chemical vapor deposition (CVD) has been known since the early 1960's. It is also known to utilize volatile acceptor or donor impurity precursors during growth process of silicon; thus leading to the formation of electrically-active regions, bounded by junctions of varying thicknesses, carrier concentrations, and junction profiles. Vapor substrate growth systems are quite general and in principle applicable to systems in which are provided pertinent kinetic and thermodynamic conditions of satisfactory balance.

The growth of single crystal silicon from the vapor phase is dependent on several important parameters all of which interract with each other to some degree. These parameters can be described in part, for example, as substrate surface crystallographic orientation, the chemical system, reaction variables, such as concentration, pressure, temperature modification, and the appropriate kinetic and thermodynamic factors. A variety of reaction systems have been investigated; however, all have the common feature that a hot single crystal surface is exposed to an atmosphere which is thermally and/or chemically decomposable. The mechanism of the silicon-forming reaction is a function of the temperature of the substrate.

In addition to known CVD epitaxially-grown silicon, epitaxial CVD processes using trichlorosilane have been demonstrated to achieve conversion yields of 50% or better and that single crystal deposition does occur at linear growth rates. It is further known that p-n junctions with theoretical I-V characteristics have been grown by CVD indicating the superiority of CVD crystal silicon over melt grown silicon. However, practical application of chemical vapor deposition to the preparation of single crystal semiconductor bodies has not been extended to the preparation of rod shaped bodies but has been limited to the preparation of thin epitaxial films on substrate in wafer form. All attempts at preparing thick, i.e., more than a few thousandths of an inch single crystal bodies, have failed because of the unavailability of adequate methods to provide and/or maintain an absolutely contamination-free surface on the substrate seed and other mechanical-chemical problems. Similarly, all attempts at preparing rod shaped bulk single crystal bodies on electrically heated single crystal filaments consisting of the same material have failed, mainly because of the unresolved difficulties with preparing and maintaining an absolutely contamination-free substrate seed surface. In previous attempts at developing processes for the direct deposition of rod-shaped single crystal bodies, energy applications have failed since direct electrical means were insufficient to provide the temperature uniformity essential to deposit a flawless single crystal body of homogeneous composition. Both a perfect single crystal structure and homogeneous chemical composition are conditions without which a semiconductor device constructed by means of that single crystal body will not function properly.

In the growth of polycrystalline silicon or single crystal silicon from deposition of silicon resulting from silicon halide-hydrogen reaction gases, the purity of the reaction gas is critical and is obtained by careful fractional distillation and by the particular design of the apparatus which assures that all materials used in the apparatus construction are very pure and do not promote contamination of the silicon halide-hydrogen reaction gases or depositing silicon under conditions of deposition. These requirements restrict the practical choice of materials that can be used for the construction of apparatus for the preparation of semiconductor silicon to quartz, graphite, silicon carbide, silver, and the like. Silver must always be thoroughly water cooled in order to avoid chemical reaction. The silicon halides used most for the preparation of high purity silicon are silicon tetrachloride and trichlorosilane. These halides will undergo pyrolysis when in contact with the hot surface and deposit elemental silicon. To obtain reasonable and economical yields, however, an excess of hydrogen gas is added to the silicon halides vapor reaction feed gas. Because of its higher silicon content, trichlorosilane will deposit more silicon than silicon tetrachloride and is therefore the preferred material for the Siemens' process for the preparation of polycrystalline silicon. However, silicon tetrachloride is preferred for the preparation of thin epitaxial films of single crystal silicon.

Silicon halides with less than three chlorine atoms in the molecule like $SiH_2Cl_2$ and $SiH_3Cl$ in particular, deposit much more silicon per mole of silicon halide consumed in the reaction but are impractical because they are not readily available and thus less desirable economically.

When trichlorosilane ($SiHCl_3$) or silicon tetrachloride ($SiCl_4$) are used in the Siemens' process, the overall reactions are assumed to be $$SiHCl_3 + H_2 \rightarrow Si + 3\,HCl \text{ and} \qquad 1.$$

$$SiCl_4 + 2\,HCl \rightarrow Si + 4\,HCl \qquad 2.$$

For a silicon halide to hydrogen mole ratio of 0.05%, thermal dynamic equilibrium is reached at 1150° C. when approximately 48% of the $SiCl_3$ moles have reacted, or 24% of the $SiCl_4$ moles. In practice, however, equilibrium is not reached in a flow-through system because the kinetics of the reaction limit the actual steady state silicon yields to about one-half of the equilibrium values, the hydrogen chloride desorption from the substrate surface being the rate controlling step in both reactions.

Any occurrence on the substrate surface that could accelerate the hydrogen chloride desorption movement of hydrogen chloride away from the surface would accelerate the deposition rate of silicon and improve the economics of the process. One proven way to accomplish this result is to improve the deposition rate by accelerating the desorption rate of hydrogen chloride by raising the temperature of the substrate surface. This approach is effective but only when relatively small concentrations of silicon halide in the reaction gas are employed. These low mole ratios are lean mixtures and result in high yield but low weight gains. Rich mixtures do not respond in the desired manner because of side reactions as follows: $SiHCl_3 \rightarrow (SiCl_2) + HCl$ and $SiCl_4 + Si \rightarrow 2 (SiCl_2)$; the side reaction producing the radical ($SiCl_2$) which is stable at the reaction temperature range and reduces the amount of reactive silicon halide available for absorption and reaction on the substrate surface. As a net effect, we see, in spite of the faster HCl desorption, less silicon being deposited as we increase the substrate surface temperature from, for example, 1150° C. to 1250° C. when molar ratios in excess of 0.05 in the trichlorosilane system and in excess of 0.01 molar ratio in the silicon tetrachloride system are utilized. In fact, at molar ratios of about 0.1 in the silicon tetrachloride system, the formation of ($SiCl_2$) becomes the dominant reaction and silicon is removed from the substrate at about 1200° C.

Another approach to improved deposition rates would be to use mixtures of silicon halides so that the overall silicon chlorine ratios increase. For example, silane ($SiH_4$) offers itself as an effective diluent and having no chlorine in the molecule would improve the silicon to chlorine ratios of silicon halide reaction gas mixtures. Silane as such cannot be used readily as a starting reaction material for the Siemens' process. Silane is not stable and decomposes spontaneously at 400° C. forming silicon and hydrogen. The silicon, unfortunately, forms a dust which is not suitable for further processing rather than a controlled deposition upon a seed rod. Only in greatly diluted reaction gas stream wherein hydrogen, helium, or the like is utilized in the presence of hydrogen chloride, can silane be used to prepare silicon in crystalline form. Particular application is therefore limited mostly to slow deposition rate processes which are used exclusively in the thin film preparation field.

SUMMARY OF THE INVENTION

To overcome the difficulties cited above, the invention provides a process preparing electronic-grade silicon bodies from slim rods pulled into and through a chemical vapor deposition chamber wherein the deposition rate is enhanced through the utilization of a small percent by weight of silane to the silicon halide-hydrogen reaction gas feed. An object of the invention is to increase the deposition rate of silicon from silicon halide-hydrogen reaction gas mixtures by adding silane in such a way as to avoid silicon dust formation while still providing for a significant improvement in the deposition rate. A method according to the invention provides high purity elemental silicon primarily for electronic semiconductor applications and in that respect is a significant improvement over prior art methods. While for the purposes of this invention description, the process is described as relates to a continuous silicon body growth system utilizing a chemical vapor deposition chamber, the inventive process would enhance other silicon halide-hydrogen deposition systems.

The invention is predicated on the use of apparatus refinements, thermodynamics, and reaction kinetics wherein a continuous process preparing bodies of crystalline silicon is comprised of the steps of heating one or more silicon slim rods to decomposition temperatures as silicon halide-hydrogen reaction gas mixtures, passing the heated silicon slim rods into a chemical vapor deposition chamber; maintaining surface temperature of the silicon slim rods from about 1000° C. to about 1300° C. through heating means; contacting the silicon slim rods with the reaction gas comprised of silicon halide-hydrogen, said reaction gas containing from about 0.2% to about 5% by weight of silane; depositing silicon on the slim rods as the rods are moved through the decomposition chamber; and withdrawing the resulting enlarged crystalline body from the decomposition chamber. In addition, use of an interior cooled wall through gas curtain means which also prohibit reactor gas from making contact with inner chamber walls may be utilized in combination with the inventive selected reaction gas feed mixture. For example, rather than use of an external gas such as air to regulate the chamber wall temperature, it is proposed to use one or more gas curtains to cool the inner wall directly; thus creating fluid or gas curtains along the substantial length of the inner wall.

In situ produced seed rod, according to the invention, is continuously drawn into and through the chemical vapor deposition chamber while being heated before entry into the chamber and simultaneously exposed to further heating and silicon halide-hydrogen reaction gases which include from about 0.2% to about 5% by weight silane resulting in the increased deposition growth rate of the silicon body while the apparatus and methodology of the invention substantially prohibit unwanted thermal silicon deposition upon the inner chamber walls or the formation of silicon dust particles.

The high velocity helium or hydrogen gas flow along the inner wall of the chamber from the bottom portion or in the alternative countercurrent to the reactor gas flow provides an effective gas curtain which prevents reaction gas from reaching the inner chamber wall surface; thus avoiding silicon deposits on the inner chamber wall for a substantial portion of the chamber. However, the effectiveness of such a curtain has certain limitations, thus providing the need for a second gas curtain to be introduced at the upper end of the chamber wall or parallel to the reaction gas flow inlet. The upper chamber gas curtain is comprised of HCl for cooling purposes as well as providing the gas curtain barrier between the upper chamber inner wall portion and the reaction gas. In addition the HCl curtain can be manipulated under process conditions to provide inner chamber wall etching if such etching is found to be necessary. Proper manipulation of for example, the HCl and hydrogen curtain prevents silicon deposition of the walls while also providing additional dilution of the silicon compound gases and in some cases preheating of process gases when the curtain gases are recycled in combination with diluent reactor gas feed streams.

By providing the quartz CVD chamber with certain gas inlets both at the top and at the bottom, the process allows for substantial hydrogen curtain to flow, for example, from the bottom of the chamber along the chamber walls providing effective cooling where it is needed most and a lesser volumn HCl curtain entering the chamber tube from the upper portion wherein the hydrogen curtain effectiveness is limited. With this arrangement, the upper chamber walls can be protected from both types of wall coatings inevitably otherwise occurring in a silicon-hydrogen-halogen system surrounding a 1200° C. substrate. The two types of wall coatings are represented schemtically as follows:

1. Hi Temperature Coating

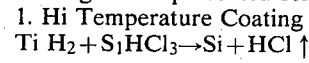

2. Lo Temperature Coating

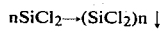

In accordance with the principles of the invention, the CVD approach was directed to bulk single crystal operation. Such an approach would not only eliminate the need for melt processing but also has the potential for producing a much improved product. The present apparatus utilized in the standard Siemens' process decomposer employing two or more free-standing filaments or slim rods providing substrate surfaces is inappropriate for the present invention since the Siemens' apparatus is unsuited for the purpose of growing single crystals. While in the epitaxial process major emphasis is placed on providing temperatures as uniform as possible across each substrate as well as from "wafer-to-wafer", no such temperature control has been achieved in the case of silicon single crystal, i.e. also called hex rod production. As a consequence of the negative resistivity coefficient of silicon, all current heated silicon is hottest on the inside. Temperature differentials between the surface and the core of silicon bodies of as much as 120 degrees centigrade have been observed. The core begins to melt when the surface temperatures reach approximately 1300° C. Also the flat areas of "hex rods" are always hotter (10° to 50° C.) than the corners and the flat areas facing another rod can be 10 to 50 degrees hotter than the "flat" facing outside, i.e. the cooler decomposer wall. These large temperature gradients naturally lead to thermal stress and lineage arrangement of the excessive dislocation generation.

Chemical vapor deposition chambers whether according to the continuous CVD process of the present invention or the Siemens' type decomposer processes for producing polysilicon share a common problem, that is, wall deposition coatings. Such wall depositions are undesirable since coatings force abortion of the process run because wall coatings prevent measurement of substrate temperature in the case of Siemens' decomposers which is taken by optical pyrometer and in addition substantial deposits of silicon on the quartz decomposer wall tend to break the latter because of the difference in thermal expansion. Wall deposits are usually less dense than the filament deposits and trend to flaking. These flakes lodge on the filaments and result there in undesirable, irregular, sometimes dendritic growths which render the material unsuitable for further processing. Even thin wall coatings react with the quartz, actually etch quartz as shown on the following schematic:

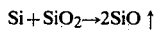

and strongly accelerate the devitrification of the fused quartz which then becomes opaque and must be at least partially remelted for the next run to clear up the crystallized layer. This is an interruptive and costly maintenance problem. By eliminating wall deposits through the present invention, a substantial improvement in the preparation of high purity silicon by continuous chemical vapor deposition can be achieved. The methodology and apparatus according to the invention wherein continuous chemical vapor deposition of silicon is even more sensitive to the requirements of an opaque chamber wall because of the focused external heating means utilized in one embodiment of the invention.

The starting slim rod surface in prior efforts is usually chemically etched, a condition which has been proven to be particularly poor for good epitaxial growth and all attempts to vapor etch the slim rod in hydrogen or hydrochloric acid did actually clean the decomposer inside which resulted in the deposition of varying impure "skins" on the slim rod. The initial deposit always showed a deep dip in resistivity as well as a tell-tale ring when cross sections were treated with preferential etches. This direct layer next to the original slim rod has always lead to what came to be believed "inevitable" chevron growth, i.e., stacking fault originated polycrystalline inserts in the otherwise single crystal "hex" rod. What is overcome by the present invention are these shortcomings by employing a continuous feed of slim rod which as an as-pulled, "virgin" surface into a tubular decomposer chamber. While slowly moving through the decomposer chamber, the slim rod is uniformly heated by focused heating means having a concentrated heat flux to the center line of the decomposer chamber which is also the center line of the slim rod and the growing semiconductor body. Part of the necessary heat will be supplied to the slim rod by passing a current through it, specifically during the preheat stage before the slim rod is introduced into the decomposer chamber.

The process according to the invention produces electronic-grade semiconductor bodies, specifically the invention is directed in part to electronic-grade semiconductor single crystal materials, for example, silicon. Following the single crystal silicon aspect of the invention, a slim rod pulling chamber is provided wherein a virgin silicon slim rod is formed in situ from the reaction of the seed crystal and a molten silicon material source with the slim rod being pulled from the growth chamber through a communication zone of the growth chamber with a chemical vapor deposition chamber wherein the slim rod surface which has been preheated in the growth chamber is simultaneously exposed to focused heating and thermally decomposable silicon containing gaseous compounds. The apparatus according to the invention is designed specifically for single crystal growth as opposed to the Siemens' decomposer chambers as discussed hereinabove; therefore the apparatus according to the invention is directed to provide a virgin silicon slim rod under suitable conditions for producing the most desirable equilibrium reaction flow of the thermal decomposition of silicon containing gaseous compounds with the result of single crystal silicon being deposited and grown on the slim rod as the slim rod is continuously pulled through the chemical vapor deposition chamber. Single crystal silicon vapor deposition is a very complex process. The present invention has utilized apparatus and methods which are based upon identification and quantification of conditions necessary to produce excellent quality single crystal silicon as the result of intelligently controlling various variables in the process. Unlike much of today's methods in producing single crystal silicon, which depends in good part upon trial and error approaches, the present invention is based on the proper approach of qualifying conditions under good single crystal silicon body can be produced through the direct thermal decomposition of elected silanes and halogenated silanes. Favorable silicon deposition conditions are greatly enhanced through the creation of gas curtains along the chemical vapor deposition chamber inner wall substantially preventing the gaseous compounds, i.e. reaction gases from reaching the wall.

Brief Description of the Drawing

The drawing is an elevated somewhat schematic view of an apparatus useful in the practice of the invention wherein a combination of two or more gas curtains are provided along the walls of the continuous chemical vapor deposition chamber in the practice of the continuous process according to the invention.

DESCRIPTION OF THE PREFERRED EMBODIMENTS

The invention provides a process for increasing silicon deposition rate from silicon halide-hydrogen reaction gas systems which are capable of pyrolitically depositing silicon on a heated seed rod under conditions which promote single crystal deposition. The process for increasing the silicon deposition rate from silicon halide-hydrogen reaction gases wherein electronic grade or polycrystalline silicon bodies can be produced utilizes the step of introducing small percentages by weight of silane to the silicon halide-hydrogen reaction gases, for example, silicon tetrachloride and/or trichlorosilane. In one embodiment, an in situ drawn virgin seed rod is introduced to the silane containing silicon halide-hydrogen reaction gases under conditions which promote single crystal deposition under conditions which allow continuous drawing of the rod through a chemical vapor deposition chamber. A significant deposition rate enhancement occurs through the utilization of silane in combination with the silicon halide-hydrogen reaction gas feed. In addition, the method of the invention can be combined with one or more gas curtains along the chemical vapor deposition chamber inner walls which cool the walls while substantially prohibiting contact with the walls of the incoming hot reaction gases which under the forced equilibrium conditions of the chemical vapor deposition chamber could deposit on the walls or flakes. The requirement of having transparent clean walls according to the preferred embodiment of the invention is critical in one environment where external heat is transported through the transparent walls in order to achieve controlled continuous chemical vapor deposition upon the growing silicon rod. The thermodynamics of a silicon halide-hydrogen system are generally understood. The equilibrium compositions are fully quantified; however the kinetics of silicon chemical vapor deposition (CVD) are very poorly understood and multiple reactions appear to occur. Quantitatively it is known that the deposition rate rises rapidly with temperature, then is less sensitive to temperature at high temperatures, and may even drop with further increase in temperature within the upper limits. Mass transfer and heat transfer in silicon CVD systems utilizing radiant heating have not previously been well understood and mostly continue to be evasive of exact qualification. Due to the complexity of the CVD process two specific goals were necessarily resolved through the invention, that is, enhanced direct deposition rates while avoiding wall deposition.

The single crystal silicon chemical vapor deposition process according to the invention can be simply described as growth of the single crystal or polycrystalline silicon from a mixture of gases containing silicon such as halogenated silanes in combination with silane and hydrogen at elevated temperatures. Behind this simple description a number of complex phenomena remain for the most part unresolved. Chemical thermodynamics establish the maximum obtainable yields which depend on temperature and initial mole ratios. Various gas phase and gas solid reactions are involved, the kinetics of which depend on temperature, gas composition, and crystal orientation. Absorption-desorption of reaction end product on crystal surfaces is also temperature dependent as are the rates of in-crystal growth nucleation. Finally the gas composition and temperature on the crystal surface are affected by the flow pattern in the reactor which determines mass transportation and transfer.

The term "continuous" as used herein and in the claims is defined as the pulling of an in situ virgin slim rod from the pulling chamber directly into and through the chemical deposition chamber whether the pulling is absolutely continuous or in stop and go motion. The concept "continuous" as defined herein is to illustrate the fact that the semiconductor bodies are produced on a virgin slim rod fashioned continuously and moved through the chemical vapor deposition chamber without break in the production scheme, with finished product being drawn from the chemical vapor deposition chamber either into the upper chamber storage area or into the atmosphere where it can be scribed and broken or sawed and removed from the continuously produced rod. The process according to the invention can be continuous in motion or can be continuous with intermittent motion through the respective chambers. In another aspect the continuous process can be defined as drawing the seed rod into and through the chemical vapor deposition chamber with a period of stop motion for growth of the semiconductor body and thereafter removing that rod segment from the chemical vapor deposition chamber which simultaneously loads the chamber with new virgin seed rod.

The in situ produced virgin slim rod or seed rod can be the result of a seed float-zone or Czochralski silicon melt source which is made available in the pulling chamber. In the case of float-zone, the continuous supply rod can be fed through the bottom portion of the pulling chamber in a continuous mode depending upon the requirements for seed rod production as the seed rod is pulled into and through the chemical vapor deposition chamber. In addition the slim rod is heated prior to entry into the chemical vapor deposition chamber and its pathway is clearly defined through a sleeve mechanism which is of sufficient diameter to allow the slim rod to pass therethrough without touching. The restrictive nature of the sleeve and communication passageway between the pulling chamber and the chemical vapor deposition chamber permits open communication for passage of the slim rod; however, it does not permit substantial gas transfer between the two chambers. According to the invention a positive pressure exists in the pulling chamber which comprises hydrogen or helium or some other suitable inert gas which will not interfere with the reaction gas thermal decomposition process of the CVD chamber. This positive pressure permits, for example, hydrogen to enter into the CVD chamber in very small amounts which will not interfere with the reaction gas thermodynamics or kinetics of depositing silicon upon the heated slim rod.

The pulling of a virgin silicon slim rod of single crystal composition is necessary in order to insure elimination of many of the causes for poly growth in a CVD chamber. For example, initially, commercially pulled single crystal slim rods, or chemically etched or prepared by other known methods, have been found to contain sufficient surface contamination or defect problems which lead to substantial poly formation upon the decomposition of the reaction gases in the CVD chamber. It should be noted however that according to the invention that the process and apparatus as presented can always be utilized for the production of polycrystalline silicon if that result is desired. In fact, it may be highly desirable for the following reasons. The present poly requirement for removing the slim rod or filament from an external slim rod puller to the reaction chamber thereby exposing the virgin surface of the slim rod to handling in an atmospheric environment inevitably causes impurities from the environment as well as particular matter to be lodged in the form of an absorbed layer on the surface. From this surface neither the adsorbed atomic or molecular species nor the particulate matter can be removed completely by predeposition vapor etching. During the following deposition of silicon from the CVD reaction the first layer will therefore be impurity rich and affected by numerous point defects which will cause polycrystalline growth in selected areas. However, the process and apparatus according to the invention can be used for continuous silicon body growth starting with one or more preheated silicon slim rods which were previously grown outside the apparatus and pulled into and through the decomposition chamber.

It follows therefore that in the traditional Siemens' process for the preparation of semiconductor grade polycrystal silicon in which externally prepared slim rods serve as substrate, there are always highly contaminated initial layers with trapped impurities which severely limit the potential of the Siemens' process to prepare ultimate degrees of purity and apparatus disclosed in this invention are also extremely useful in the preparation of polycrystalline silicon rod of superior purity, for example, as needed for float zone feed. The process and apparatus can also be utilized for a variety of semiconductor body production wherein the deposition material is acquired through thermal decomposition of gaseous compounds. The above described processes are particularly advantageous when applied to silicon. The method, however, is also applicable to other semiconductor substances which are required in extreme purity, and are preferred in monocrystalline form; for example, in the manufacture of electronic semiconductor devices such as rectifiers, transistors, solar cells, photo cells, and the like.

Once the virgin slim rod which has been preheated and drawn into and through the CVD chamber the rod is simultaneously exposed to focused heating and silicon-containing decomposable gaseous compounds. The CVD chamber is arranged in such a manner as to afford continuous focused heating in a geometrical manner on the rod for substantially the entire length of the chamber. The method of heating has to provide sufficient energy to maintain the substrate surface temperature between 1000° C. and 1300° C., preferably 1150° C.-1250° C., at all times and has to provide sufficiently uniform heating to the substrate so that the surface temperature does not vary more than about ±10° C., preferably ±5° C. or less, along the entire deposition area.

Various gas feed arrangements can be utilized in the CVD chamber with one preferred embodiment inclusive of a countercurrent flow of reaction gas as opposed to the continuous movement of the slim rod and/or growing body. The process according to the invention does not require rotation of the slim rod or of the drawing body which is generally the case of modern remelt methods; however, if desired, rotation of the growing body could be utilized according to the invention when, for example, an improvement of deposition uniformity could result.

In the continuous process and apparatus for producing semiconductor bodies from slim rod through the utilization of a CVD chamber, the withdrawal of the grown body or of silicon hex rod can be achieved by various means. One suitable means is through a gas look which incorporates movement of the hexagonal body to be a restricted zone where it first contacts one reactive gas jet thereafter followed by contact with a vacuum zone and thirdly an insert gas jet. These various gas-vacuum zones can be repeated, the number according to the need. Such gas seal means are achievable because of the relatively low pressure of the reaction gas system within CVD reaction chamber. The gas seal means also permits various shaped articles, i.e. cylindrical, irregular shaped cylindrical and hexagonal configurations to pass through a restricted mechanical barrier without touching the barrier. In addition, these gas seal means zones can be utilized for initial cooling of the growth body as it leaves the reaction chamber and enters into atmospheric conditions or storage conditions. Once the growth body has been drawn for a distance somewhat removed from the CVD chamber and gas seal means in the atmosphere, the body can be scribed, snapped, broken or sawed from the continuously pulled growth body source, the separation depending on temperature of the growth body at the point of separation and lack of mechanical shock to the continuously growing body system.

In one embodiment of the invention, the growth body is pulled from the CVD chamber through a mechanically restricted zone which permits withdrawal of the body without touching the walls of said zone with the body being drawn into an expansion chamber comprised of, for example, a bellows expansion chamber which permits the growth body to achieve various lengths outside the CVD chamber depending upon the length of the bellows apparatus. One advantage of such a system permits the cool down of the rod to be achieved in controlled atmospheric conditions. The bellows storage chamber process would necessitate eventual temporary shutdown of the continuous process; however, such shutdown would not necessarily contaminate the system for restart achieved by thermal build up and reaction gas introduction to the CVD chamber after an inert gas purge. Here again the CVD chamber is at a relatively low pressure during operation and positive pressure can be maintained between the CVD chamber and the bellows reception chamber during continuous growth and during shutdown removal of the grown body.

In another version of the slim rod puller, reaction chamber, bellows storage chamber assembly, a gas seal means could be provided between the deposition chamber and the bellows storage chamber thus eliminating the need for any interruption of the deposition process during removal of the product rod from the bellows storage chamber.

Before discussing the apparatus illustrated in the drawing which is useful for practicing the invention it is noted that a main feature of the invention is to allow one to select specific deposition rates at an optimum value and to maintain this value during the entire deposition process in a continuous mode. In that regard, it is desirable to select the deposition rate as large as possible, but in so doing to also insure that neither homogeneous nucleation of silicon, in the free gas phase nor deposition of silicon on the interior walls of the CVD chamber occurs. In addition the utilization of a virgin silicon slim rod prepared in situ creates the best possible deposition surface for creating single crystal silicon bodies.

The preferred embodiments of the apparatus and process to be employed for the purpose of the invention are schematically illustrated in the drawing.

In the Figure, a source feed rod of polycrystalline silicon 1 having a direct current connection 5 is automatically fed through means 3 in through seal means 7 into the virgin seed rod pulling chamber 9. The direct current connection 5 is utilized for resistive preheating of the virgin seed rod or slim rod 19 before entry into the chemical vapor deposition chamber 23. The source rod seal means 7 can be of various constructions which allow longitudinal transport into a pressurized chamber. The slim, rod pulling chamber 9 is equipped with chamber inlet gas facilities 11 which maintain a positive pressure upon the pulling chamber 9 utilizing, for example, hydrogen or helium or some other suitable gas which is inert to the thermal decomposition reactions which occur in the CVD chamber 23. Pulling chamber 9 may be vented by outlet means; however, the positive pressure should be maintained and the outlet can be through the quartz sleeve 21.

The source feed rod 1 provides a source rod melt 17 through utilization of a high energy heating coil 15, for example, similar to physical conditions utilized in commercial float zone technology. The virgin slim rod 19 is produced through the action of a single crystal seed and drawing of same from the source rod melt 17. The virgin slim rod 19 is continuously pulled from the pulling chamber 9 and into and through the CVD chamber 23 through a communication zone between chambers 9 and 23 comprised of a quartz sleeve 21 which serves the purpose of reducing temperature loss of the CVD chamber and in combination with the positive pressure of the pulling chamber 9 prohibits process or reaction gas loss from CVD chamber 23. In addition, the quartz sleeve 21 in the restrictive communication zone between the two chambers prohibits contact of the seed rod 19 with the process gas in the CVD chamber 23 until ideal reaction conditions exist which occur upon entry into the CVD chamber 23 through the simultaneous focused heating from the radiant heat furnace 25 in combination with CVD chamber 23 transparent walls 27. The slim rod 19 is contacted with process gas from the process gas feed head 26 which is in communication with process gas inlet 28. Hydrogen chloride gas inlet 32 is introduced into the chamber along the upper interior chamber walls through hydrochloric gas flow guide 30 while the lower gas curtain comprised of hydrogen or helium or the like is introduced through inlet 34 which is in communication with flow guide 36 which guides the gas curtain along the inner walls of the lower portion of the chamber and is shielded away from the entering slim rod 19 and communication quartz sleeve 21. The various arrangements of process gas entry heads and gas curtain flow guides when utilized in combination provide gas flow patterns which enhance reaction process as well as effectively deter unwanted chamber wall reactions. The gas curtain inlets 32 and 34 can be arranged in various positions along the chamber walls 23 depending upon the geometry of the chamber itself and the needs for multiple inlets and flow guides. Gas curtains can be parallel to the flow of the reaction gas, for example the hydrogen chloride flow guide 30 which parallels the reaction gas feed head 26 or can be countercurrent to the reaction gas flow as in the case of the hydrogen or helium gas curtain. The preferred embodiment is the utilization of the hydrogen or helium gas curtain in a counterflow pattern to the reaction gas and a parallel gas flow pattern in the opposite end of the chamber of the hydrogen chloride curtain. The reaction gas is set toward the center of chamber 23 while the gas curtains are fed along the inner wall of chamber 23.

The resulting hexagonal silicon body 31 increases in diameter as it proceeds through the CVD chamber 23 reaching a maximum rod diameter 33 at the upper end portion of chamber 23. The continuous process and the apparatus according to the invention provide a gas seal means 37 at the upper end of chamber 23 which permits continuous drawing of the enlarged hexagonal body from the chamber without loss of process gas or contamination of the CVD chamber. The continuous motion of the seed rod and the growth rod is achieved through automatic rod pulling means 39 which are exterior to the CVD chamber 23.

Other embodiments of the invention which are not shown in the Figure would be the utilization of an expansion type bellows chamber affixed to the upper end of the chamber 23 which may or may not be in combination with a gas seal means 37.

In the following examples, the invention is illustrated fully with experimental data where increased deposition rates of silicon from silicon halide-hydrogen process gas is achieved by adding silane in such a way to avoid dust formation but still permits a significant improvement in the deposition rate. In examples 1 and 2 following, commercial epitaxial reactor was utilized which allows heating of the silicon substrate wafer to about 1200° C. and over and admittance of controlled amounts of silicon halide vapor and silane and hydrogen gas into the reaction chamber. The substrate was placed in a rotating graphite susceptor. The susceptor was heated by an RF coil which was located beneath the susceptor and the gases were injected by means of a nozzle arrangement and impinged upon the substrate surface at a velocity of 15 meters per second. The results as indicated in examples 1 to 2 provide the realization that by adding silane to silicon tetrachloride or trichlorosilane, hydrogen process gas mixtures, an increase in deposition rates occur. The increase in deposition rates is larger than can be accounted for by silane weight addition alone. The increase in deposition rate was temperature dependent. This relationship has been used to calculate the activation energies of the respective reactions. Adding silane to a silicon halide process reaction gas reduces the activation energy of the silicon delivering reaction. The lower the substrate temperature, the more significant the improvement becomes. The results of the following examples support the conclusion that silane when added to silicon halide-hydrogen reaction gases in any process changes the silicon-chlorine ratio on the substrate surface significantly more than in the gas phase. The precise surface reaction mechanism is not known but the lowering of the activation energy suggests "catalytic" action and that the effect can be used to improve the economics of any pyrolytic silicon decomposition-deposition process.

EXAMPLE 1

Fifty milliters per minute of silane were added to a process gas consisting of 1.3 liters of Sicl₄ vapor plus 22.6 liters of hydrogen increasing the silicon content of the gas by only 3.8% by weight. The deposition rate of silicon was determined to increase from 1.87 microns per minute to 2.47 microns per minute or a 32% enhancement in deposition rate resulting from the silane addition. The temperature was 1125° C. When the substrate surface temperatures were brought up to 1150° C., the deposition rate rose from 3.33 microns per minute to 4.1 microns per minute for 23% increase in deposition rate resulting from the silane added reaction gas mixture. These rates were measured on (110) silicon planes.

EXAMPLE 2

Silicon substrates having (112) orientation utilized in the same reactor conditions as described in example 1, with the following deposition rate increases measured at 1125° C. The deposition rate utilizing the silicon halide-hydrogen reactor gas feed stream was 1.74 microns per minute whereas the reactor gas feed stream utilizing silane pushed the deposition rate to 2.41 microns per minute resulting in a 39% deposition rate. When repeating the experiment at 1200° C., the rate rose from 4.55 microns per minute to 5.26 microns per minute resulting in a 16% deposition rate increase through the utilization of silane in combination with silicon halide-hydrogen reactor gas systems.

The experimental results as illustrated in examples 1 and 2 clearly teach that the addition of silane is beneficial for the deposition of elemental silicon from silicon halide-hydrogen reaction gas mixtures because it increases the deposition rate significantly beyond what is expected.

I claim:

1. A continuous process for preparing bodies of crystalline silicon comprising:
   a. heating one or more silicon slim rods to decomposition temperature of gaseous silicon compounds;
   b. passing the heated silicon slim rods into a chemical vapor deposition chamber;
   c. maintaining surface temperature of the silicon slim rods from about 1000° C. to about 1300 C. through heating means;
   d. contacting the silicon slim rods with a reaction gas comprised of silicon halide-hydrogen reaction gas containing from about 0.2% to about 5% by weight of silane;
   e. depositing silicon on the slim rods as the rods are moved through the decomposition chamber; and
   f. withdrawing the resulting enlarged crystalline silicon bodies from the decomposition chamber.

2. The continuous process according to claim 1 wherein the slim rods upon entry into the chemical vapor deposition chamber and transport chamber are exposed to cocentric, uniform heating through geometrically focusing heating means.

3. The continuous process according to claim 2 wherein the heating means is comprised of a radiant heat surrounding the chamber and focusing the heat onto the slim rods through transparent walls of the chamber.

4. The continuous process according to claim 2 wherein the slim rods are simultaneously exposed to the focusing heating means and the decomposable gaseous compounds.

5. The continuous process according to claim 4 wherein the thermally decomposable silicon containing gaseous compounds are comprised of trichlorosilane.

6. The process according to claim 1 wherein the continuous movement of the slim rods into and through the chemical vapor deposition chamber are countercurrent to the decomposable gaseous compound flow.

7. The continuous process according to claim 1 wherein the resulting enlarged semiconductor bodies exit the chemical vapor deposition chamber through an exit means which provide cooling of the semiconductor body before entry into atmospheric storage zones.

8. The continuous process according to claim 1 wherein the enlarged semiconductor bodies exit from the chemical vapor deposition chamber into an expandable chamber zone which is in communication with the chemical vapor deposition chamber.

9. A continuous process for preparing single crystal silicon comprising:
   a. pulling a virgin slim rod in situ in a pulling chamber from the action of the seed crystal upon a molten silicon source;
   b. heating the single crystal silicon slim rod to decomposition temperatures of gaseous silicon compounds;
   c. passing the heated single crystal silicon slim rod into a chemical vapor deposition chamber;
   d. maintaining surface temperatures of the single crystal silicon slim rod from about 1000° C. to about 1300° C. through heating means;
   e. contacting the silicon slim rod with a reaction gas comprised of silicon halide-hydrogen reaction gas containing from about 0.2% to about 5% by weight of silane;
   f. creating a first gas curtain selected from the group consisting of hydrogen, helium, neon, argon, krypton, xenon, and radon along the chemical vapor deposition chamber inner wall, the first gas curtain flowing countercurrent to and entering an opposite zone to the reaction gas entry and flow;
   g. creating a hydrogen-chloride curtain along the inner wall in the vicinity of reaction gas entry to the decomposition chamber;
   h. depositing silicon on the surfaces of the single crystal silicon slim rod as the rod is moved through the decomposition chamber; and
   i. withdrawing the resulting enlarged single crystal silicon body from the decomposition chamber.

10. A continuous process according to claim 9 wherein a positive pressure differential exists between the pulling chamber and the chemical vapor deposition chamber resulting in a positive gas flow from the pulling chamber to the chemical vapor depositon chamber.

11. A continuous process according to claim 10 wherein the gas forming the pressure from the pulling chamber to the chemical vapor deposition chamber is selected from the group consisting of hydrogen, helium, neon, argon, krypton, xenon, and radon.

12. The continuous process according to claim 9 wherein the thermally decomposable silicon containing gaseous compounds are comprised of trichlorosilane.

* * * * *